United States Patent [19]

Aslami

[11] 4,212,663

[45] Jul. 15, 1980

[54] REACTANTS DELIVERY SYSTEM FOR OPTICAL WAVEGUIDE MANUFACTURING

[75] Inventor: Mohd A. Aslami, Dhahran, Saudi Arabia

[73] Assignee: Corning Glass Works, Corning, N.Y.

[21] Appl. No.: 872,619

[22] Filed: Jan. 26, 1978

Related U.S. Application Data

[63] Continuation of Ser. No. 801,659, May 31, 1977, abandoned.

[51] Int. Cl.$^2$ .................... C23C 13/12; C03B 19/06
[52] U.S. Cl. ........................... 65/144; 65/18; 118/724; 118/726
[58] Field of Search .................... 65/144, 3 A, 18; 118/724, 726; 427/163, 167

[56] References Cited

U.S. PATENT DOCUMENTS

| | | | |
|---|---|---|---|
| 3,801,294 | 4/1974 | Schultz | 65/18 |
| 3,823,531 | 7/1974 | Crawley | 55/233 |
| 3,826,560 | 7/1974 | Schultz | 65/18 X |
| 3,925,039 | 12/1975 | Ziegler | 55/223 |

OTHER PUBLICATIONS

Tischer, Report No. R-5445-2, "Aurora-Equilibrium Fume Delivery System", Corning Glass Works Research and Development Laboratory, Aug. 13, 1975.
Norman, "Absorption, Distillation and Cooling Towers," John Wylie & Sons, 1961, pp. 74, 75, 178 and 179.
Van Nostrand's Scientific Encyclopedia, 4th Edition, D. Van Nostrand Company, 1968, pp. 753-754.

*Primary Examiner*—Richard V. Fisher
*Attorney, Agent, or Firm*—Walter S. Zebrowski; Richard E. Kurtz; Frederick W. Powers, III

[57] ABSTRACT

Apparatus for forming a vapor of material to be hydrolyzed and/or oxidized and entraining the vapor in a carrier gas. The source material, in liquid form, is pumped to a point in the column above a porous packing. As the liquid progresses downward through the packing, it encounters a rising countercurrent of carrier gas. The source material vaporizes and is delivered to vapor deposition by the carrier gas. The source material vaporized in the apparatus may alternatively be delivered to an externally heated tubular reactor, or to any other kind of chemical vapor deposition (CVD) reactor.

21 Claims, 2 Drawing Figures

REACTANTS DELIVERY SYSTEM FOR OPTICAL WAVEGUIDE MANUFACTURING

This application is a continuation of application Ser. No. 801,659, filed May 31, 1977, now abandoned.

BACKGROUND OF THE INVENTION

The present invention relates to glass producing apparatus, and more particularly to improved means for supplying vaporized source material to an apparatus for forming blanks to be drawn into optical waveguides.

Certain glass making processes, particularly vapor deposition processes used to form optical waveguide blanks, utilize a flame to which a vaporous source material is added. In the flame the source material becomes a soot which is deposited upon a rod or tube in successive layers until a desired size is obtained. The rod may then be removed and the finished item is then heated and fused into a glassy member referred to as a blank. In another process the vaporous source material is directed into a heated tube. The material is deposited within the tube in successive layers to produce a fused blank. The blank is subsequently heated and drawn into an elongate, fine strand. Inasmuch as the structure of the drawn strand reflects the structure of the drawing blank, it is important that the physical characteristics of the blank be carefully controlled. This is particularly true in forming optical waveguides, since small inclusions and other imperfections can virtually destroy the utility of the guide. In addition the index of refraction of the material must be carefully controlled.

As is familiar to those skilled in the art, optical waveguides commonly exhibit a first, higher index of refraction near the core or center thereof; and a second, lower index of refraction at a point radially outward from the core. The gradient of the index of refraction may be varied continuously or discontinuously, and may exhibit a linear, parabolic, or other desired characteristic. Information concerning the construction and use of optical waveguides may be found in "Fiber Optics Principles and Applications" by N. S. Kapany, Academic Press, 1967; "Geometrical Optics of Parabolic Index-Gradient Cylindrical Lenses" by F. P. Kapron, Journal of the Optical Society of America, Vol. 60, No. 11, pages 1433-1436, November 1970 and "Cylindrical Dielectric Waveguide Mode" by E. Snitzer, Journal of the Optical Society of America, Vol. 51, No. 5, pages 491-498, May 1961.

In order to effect a change in the index of refraction of a blank being formed by the vapor deposition process, the chemical composition of the source materials which comprise the deposited soot may be varied. For example, a hydrolyzing and/or oxidizing burner may be supplied with a silicon-bearing vapor. The vapor mixture is hydrolyzed to form a glass soot which is subsequently fused to form a high quality glass. At the same time, one or more additional vapors can be supplied to the hydrolyzing burner, each vapor being constituted of a chemical termed a "dopant" whose presence affects the index of refraction of the glass being formed.

In order to form a blank having generally consistent properties, and to assure an even distribution of the glass-forming soot, it is necessary to supply a hydrolyzing burner with a substantially constant flow of vaporized source material entrained in a carrier gas. Accordingly, systems have been devised for controlling the carrier gas flow, and the rate at which source material is vaporized and entrained into the carrier gas. Due in part to the multiplicity of factors which determine the amount of vapor introduced into a hydrolyzing flame at any given time, fluctuations in the deposition rate of the various vapor deposition processes often occur. Accordingly, it will be appreciated that it would be highly desirable to provide a system for delivering vaporized source material to a hydrolyzing burner in a consistent, highly controllable fashion.

It is therefore a object of the present invention to provide improved apparatus for supplying vaporized source material to a vapor deposition means.

Another object of the present invention is to provide improved apparatus for controllably vaporizing liquid source material.

Yet another object of the invention is to provide apparatus which assures the entrainment of a precise amount of source material in a carrier gas.

Still another object is to provide a system for entraining liquid source material in a carrier gas with a higher precision than any heretofore known.

SUMMARY OF THE INVENTION

Briefly stated, in accordance with one aspect of the invention the foregoing objects are achieved by providing a column having a packing therein, and means for circulating liquid source material through the packing. Pressurized carrier gas is introduced into the packing and flows therethrough, the source material vapor becoming entrained in the carrier gas. The gas leaves the column through an exhaust port and is conducted to the site at which it is to be deposited, such as the surface of a rod or tube.

In a presently preferred embodiment of the invention, the packing-containing column is disposed above a reservoir and heating means provided for maintaining the material in the reservoir at a predetermined temperature. A second packing is provided in the column above the point of introduction of the source material, and is maintained at a predetermined temperature advantageously higher than the temperature of the material in the reservoir.

BRIEF DESCRIPTION OF THE DRAWINGS

While the specification concludes with claims particularly pointing out and distinctly claiming the subject matter which is regarded as the invention, it is believed that the invention will be better understood from the following description of a preferred embodiment taken in conjunction with the accompanying drawings in which:

DESCRIPTION OF A PREFERRED EMBODIMENT

Figure 1:
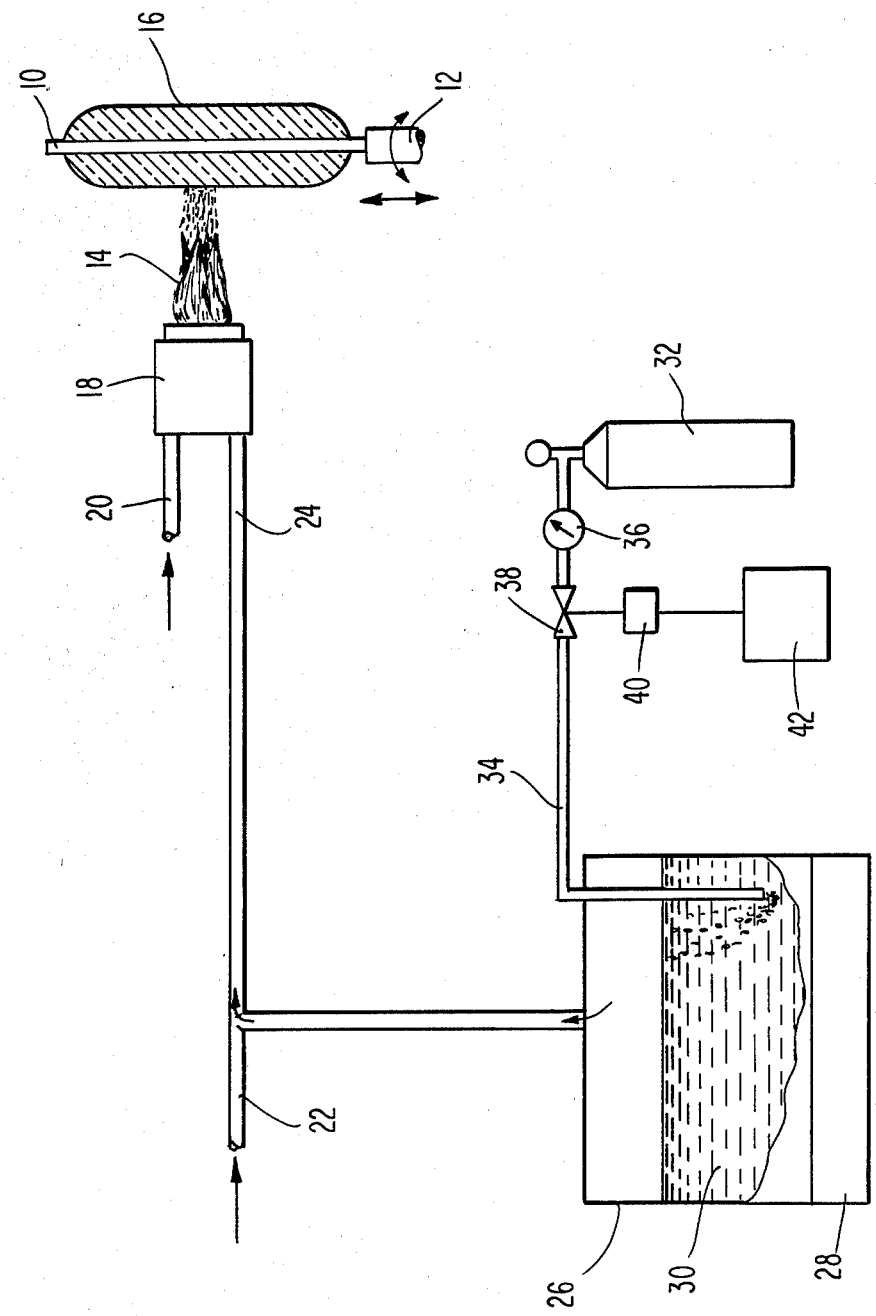
FIG. 1 illustrates prior art apparatus for supplying vapor to a deposition site.

Referring to FIG. 1, a substantially cylindrical starting member 10 supported upon a mandrel 12 or the like is rotated and translated with respect to a hydrolyzing flame 14 so as to accumulate a substantially cylindrical layer of glass soot 16 thereabout. Flame 14 issues from a hydrolyzing or chemical vapor deposition (CVD) burner 18 and is supplied with a fuel gas, such as natural gas, from a remote source through a conduit 20. Materials to be hydrolyzed and/or oxidized in flame 14, typically vapors entrained in one or more carrier gases, are supplied to the burner through other conduits 22, 24. In this manner a number of different source materials may be combined at the hydrolyzing flame in order to deposit a layer of glass soot having the desired chemical and optical characteristics. One example of such a process is set forth in U.S. Pat. No. 3,826,560—Schultz.

The source material flowing to the hydrolyzing flame through conduit 24 comprises a liquid initially disposed in a reservoir 26 remote from the hydrolyzing flame. The reservoir, which may be a closed tank formed of a material which does not react with the starting material, has a heating unit 28 associated therewith along with appropriate controls (not shown) for maintaining the starting material 30 at an appropriate temperature.

A carrier gas kept in a tank 32 is introduced into reservoir 26 through a second conduit 34. A pressure control 36 and valve 38 are provided in the conduit so that the rate of flow of the carrier gas into the reservoir may be controlled. In order to more easily operate the sytem it is anticipated that valve 38 is of a type which is controlled electromagnetically or by means of a motor. Accordingly, an electric motor 40 is coupled to the valve, and operated by a controller 42 to cause the flow of gas from tank 32 to vary in a desired manner.

In operation gas from tank 32 is introduced below the surface of the liquified source material within reservoir 26. The rate of flow of the gas is determined by the setting of valve 38, which is in turn regulated by controller 42 according to some mode of operation or "program." It may, for instance, be desired that the fraction of the material deposited attributable to source material 30 should decrease as a function of time so that a gradient is established in the composition of the glass. Alternatively, it may be desired to establish a constant flow of carrier gas which ceases at a point corresponding to a given radial dimension of glass soot 16 so that an abrupt change in composition is effected.

The gas which is introduced beneath the surface of the starting material bubbles upwardly through the material, becoming saturated or partially saturated with vapors of the starting material. The degree of saturation of the carrier gas, and the percentage of vapor to be entrained, is a function of a number of system parameters. The pressure established within reservoir 26 is obviously a factor. Further, the temperature of the system, as established by heating unit 28, is also critical to the operation of the system. By manipulating these and other parameters a desired value of saturation of the carrier gas may be attained, and a flow of source material vapor established to hydrolyzing flame 14 to support the deposition of glass soot upon member 16.

At the same time other source material systems, similar to that shown in FIG. 1, may be operated for supplying still other constitutents to the hydrolyzing flame. For example, reservoir 26 may contain silicon in the form of $SiCl_4$ to provide the basic siliceous soot for the glass material 16. The second input conduit 22 may be coupled to a reservoir similar to reservoir 26, but containing a dopant such as a germanium-bearing solution, for example $GeCl_4$ or the like. As will be recognized by those skilled in the art the relative amount of germanium material combined with the siliceous material determines the index of refraction of the resulting, fused end product. By modifying the rate of flow and/or the degree of saturation of the carrier gas according to some predetermined relationship the index of refraction of the resulting glass blank can be controlled.

Although systems such as that shown in FIG. 1 have been used widely and often produce acceptable results, the sensitivity of the actual flow of entrained vapor to process parameters has made it extremely difficult to control the nature of the soot deposition upon the glass blank 16 with great precision. As optical waveguides become more sophisticated and accordingly more critical in design and structure, the systems such as that shown in FIG. 1 simply do not exhibit the requisite precision and controllability required to produce an end product having the desired characteristics.

Figure 2:
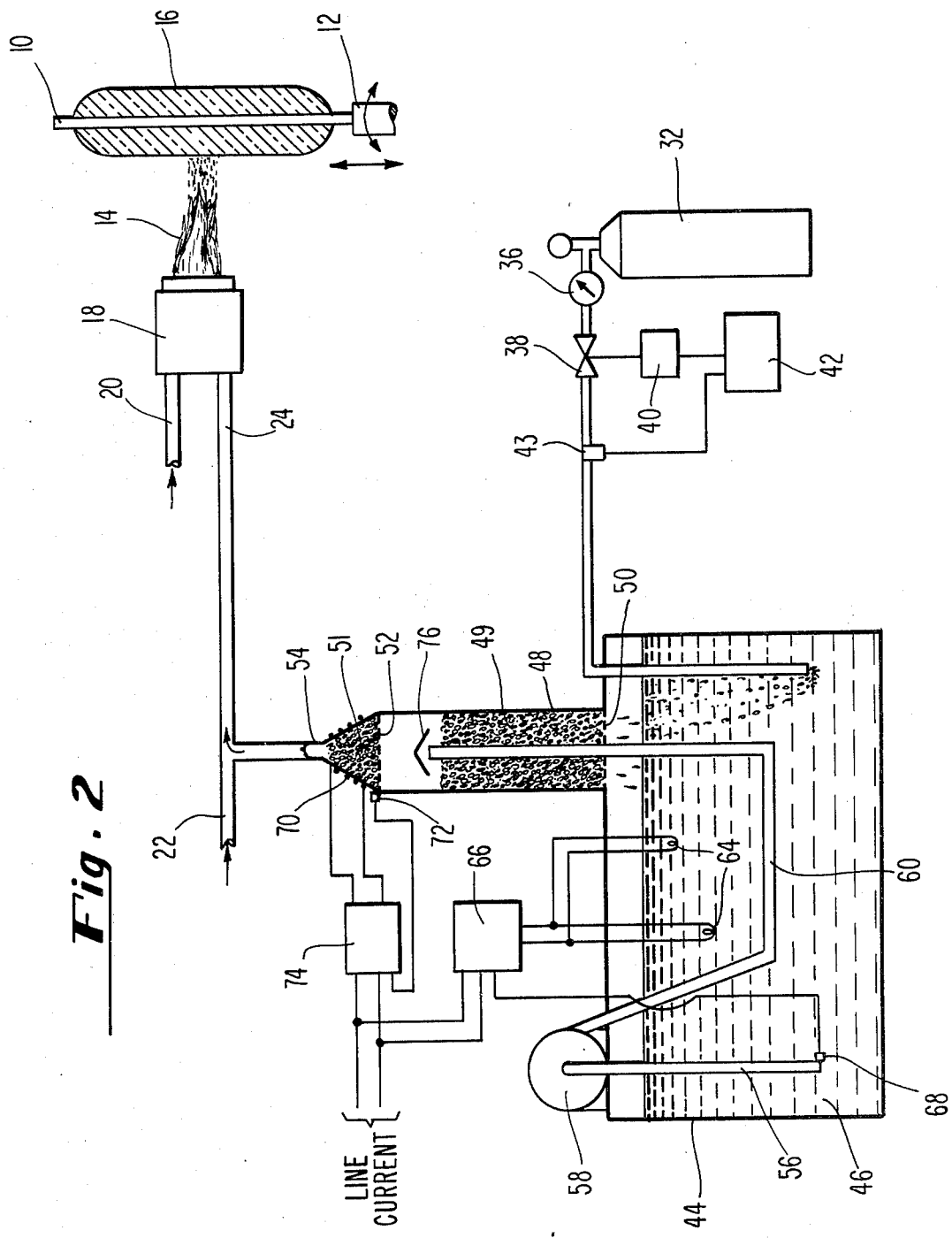
FIG. 2 depicts a system constructed in accordance with the present invention.

FIG. 2 illustrates an apparatus which supplies vaporous starting material to a deposition apparatus with a great deal more precision and controllability than was possible with the prior art systems such as illustrated in FIG. 1. As in FIG. 1, starting with an appropriate mandrel or the like 12 one or more layers of glass (or more properly, glass soot) is gradually built up upon the starting member by a flow of soot issuing from vapor deposition means 18. In the presently preferred embodiment the deposition means comprises a hydrolyzing burner from whose flame 14 a flow of glass soot is projected.

Fuel gas enters the hydrolyzing burner 18 through an appropriate conduit 20, and other conduits 22, 24 are provided for receiving source materials in vapor form.

A reservoir 44 contains a quantity of liquid source material 46 which may be $SiCl_4$, or alternatively a dopant such as $GeCl_4$, $PCl_3$, $BBr_3$, or other appropriate material. Many other materials may satisfactorily be used as a dopant either alone or in combination with one another. Examples of such materials are zirconium oxide, tantalum oxide, and titanium oxide.

A column 48 formed of glass, stainless steel or other appropriate material is disposed in fluid flow communication with reservoir 44. It has been found most convenient to place the column above the reservoir, so that the reservoir in effect forms the lowermost end of the column for purposes which will be made clear hereinafter. A first, lower packing 49 is disposed within the column and retained by a perforated grid or the like 50. In like manner a second, upper packing 51 is retained in the column by means of grid 52. The column 48 is provided with an outlet 54 near the upper end thereof, and the outlet is coupled to the hydrolyzing burner 18 through conduit 24. A pipe 56 extends from a pump 58 to a point below the surface of the source material, and material is discharged by pump 58 through another pipe 60 which extends from the pump to a point in column 48 above the first packing.

While the specific material from which packings 49, 51 are formed is not critical to the operation of the present invention, in a successfully tested embodiment of the invention raschig rings formed of a glass-ceramic material were used. The rings were of approximately ¼" in diameter, and were themselves not porous to the liquid starting material. In the aggregate, however, the packing may be considered porous inasmuch as it will allow the liquid starting material to seep through it. The packings thus provide a very large surface area over which the source material is distributed. It is anticipated that other packing materials may be used to form a porous packing exhibiting the necessary surface area, it only being necessary that the packing itself not absorb a substantial amount of the liquid source material and be substantially inert in the presence of the source material.

The second packing 51 may be substantially identical to the first, lower packing 49. The use of an upper packing such as that shown at 51 is considered optional, and its function is primarily to assure that unvaporized drops of the starting material do not exit from the column.

An appropriate carrier gas is supplied from a container 32 by way of a flow control means such as valve 38, controlled by a motor 40 and programmed flow rate controller 42. A mass flow rate transducer 43 is placed in flow sensing relationship with the line in which the carrier gas flows. The signal outputted by transducer 43 is applied to controller 42 so that the mass flow rate of the carrier gas may be controlled.

The gas may be oxygen, in which case it will mix with the fuel gas in burner 18 and support full combustion of the fuel material. Alternatively the carrier gas may be an inert substance such as nitrogen which affects neither the nature of the hydrolyzing flame nor the composition of the soot, but merely serves to convey the source material to the flame. A pressure regulator 36 is also provided. The carrier gas is introduced into column 48 from the reservoir, preferably by being bubbled through the liquid source material in the conventional manner.

In order to maintain the liquid source material at an appropriate temperature, temperature control means including immersion heaters 64 are disposed in heat transfer relationship with the source material. A temperature controller 66, which may be selected from the many commercially available units, is coupled to a temperature sensor 68 disposed adjacent the inlet of the pickup pipe 56. Accordingly, the temperature of the source material being pumped to column 48 is monitored and the information thus derived is used to control the operation of immersion heaters 64.

In the preferred embodiment illustrated another heating unit 70, which may be a simple resistive heater element, is disposed in heat transfer relationship with the second packing 51 within column 48. Another temperature sensor 72 is placed in close connection with the second packing to allow the temperature thereof to be closely controlled. A second temperature control means 74, which may be substantially identical to controller 66, is also provided and both temperature control means coupled to a source of line current.

While the apparatus of FIG. 2 performs a similar function to that of FIG. 1 inasmuch as it supplies a controlled quantity of vaporous starting material to the hydrolyzing burner, it allows a degree of control over the vapor deposition process which is far greater than that heretofore available with the result that optical waveguides having superior transmissive characteristics can be formed.

When pump 58 is energized it draws liquid source material 46 upwardly through pipe 56, and discharges it into column 48 at a point above the first, porous packing section. The upper end of discharge pipe 60 may be fitted with a deflector 76 or the like to cause the liquid material to be evenly distributed over the porous packing. Any liquid which is sprayed upwardly, or splashes upwardly from the surface of the first packing, encounters the upper packing 51. In both packings, the source material filters downwardly through the packing and is distributed over the surface area of the packing material.

Carrier gas from container 32 is discharged into reservoir 44, bubbling upwardly through the liquid source material and entering column 48 through grid 50. The rate at which the carrier gas flows into the column is determined by the programming of flow rate controller 42, and is maintained at the desired value by mass flow control system. By using a mass flow control, rather than controlling the volume rate of flow, variations in temperature and pressure of the carrier gas can be compensated for so that a constant mass rate of flow of the carrier gas is achieved. Flow rate controller 42 may comprise a Model 5300 Data-Trak programmer manufactured by R-I Controls, a division of Research, Inc. of Minneapolis, Minn. Various mass flow rate controllers are commercially available and suited to respond to an inputted signal, as for instance from flow rate controller 42, to maintain the requisite mass rate of flow of the carrier gas.

As the carrier gas progresses upwardly through the packings of column 48 it comes into intimate contact with the source material distributed over the surface of the packing elements. Since the surfaces of the packing elements themselves are not porous, the source material merely wets them and is distributed over a great surface area thereby enhancing its entrainment into the carrier gas. The volume of the packing is sufficient to cause the carrier gas to become completely saturated as it passes through the wetted packing. The present inventor has discovered that this method of bringing the carrier gas into intimate contact with liquid source material is far more reliable and consistent than bubbling the carrier gas through the source material in accordance with prior art teachings. As a result of this saturation of the carrier gas, the total volume of the source material vapor and the volume of the carrier gas flowing to the hydrolyzing flame are far more predictable and consistent than with the prior art approaches.

After the carrier gas leaves the first, lower porous packing 49 it may be immediately discharged to the hydrolyzing burner head 18; or may be passed through a second, upper packing 51 to insure that the carrier gas is fully saturated, and to prevent droplets of the source material from being entrained into the flowing gas.

It has been found that in order to assure complete and consistent vaporization and entrainment, the conduit leading from the column to the hydrolyzing burner should be maintained at a somewhat higher temperature than that of reservoir 44. In a successfully tested embodiment the source material within the reservoir was maintained at approximately 35° C., while the second, upper packing 51 and conduit 24 were maintained at approximately 40° C. In addition, it is important that the temperature of the source material being recirculated through column 48 be maintained at the proper temperature. Accordingly, immersion heaters 64 are placed in the flow path between the lower end of packing 49, and the inlet of pickup pipe 56. It is anticipated that liquid source material flowing down through the porous packing 49 will lose some of its thermal energy, falling through grate 50 and returning to the reservoir at a temperature somewhat lower than the ambient reservoir temperature. In order to assure that the cooled, newly returned source material does not find its way into the pickup pipe 56 before it attains the desired temperature, the immersion heaters are disposed in such a location that the returning source material will be heated before it reaches the area of the pickup pipe. By disposing the pickup pipe at a point in the reservoir remote from the point at which liquid source material is discharged from the column, the chance of recycling cooled source material is minimized. Further, by placing the temperature sensor 68 at the inlet of pickup pipe 56 the heaters can be controlled to maintain the temperature of the source material being recycled at the desired value. Discharge pipe 60 extends back through the source material to aid in maintaining the source material at a substantially constant temperature.

It will now be understood that there has been disclosed an improved system for entraining vaporous source material into a carrier gas in a precisely controlled manner. As will be evident from the foregoing description, certain aspects of the invention are not limited to the particular details of the examples illustrated, and it is therefore contemplated that other modifications or applications will occur to those skilled in the art. For example, while an outside vapor deposition process is illustrated by the instant Figures, it should be apparent to those skilled in the art that the illustrated system lends itself equally well to inside vapor deposition processes and to similar uses wherein the flow of vapor to the vapor deposition means must be controlled within a narrow range. It is accordingly intended that the appended claims shall cover all such modifications and applications as do not depart from the true spirit and scope of the invention.

What is claimed as new and desired to be secured by Letters Patent of the United States is:

1. Apparatus for forming particulate material, comprising:
   vapor deposition means for receiving at least one source material vapor entrained in a carrier gas and directing the vapor to a substrate to form a layer of material having a predetermined composition;
   means for disposing a substrate in proximity to said vapor deposition means for accumulating said material;
   a column including a porous packing material disposed therein, said column having an outlet disposed above said packing and in fluid flow communication with said deposition means;
   a reservoir in fluid communication with said column for receiving liquid source material flowing through said packing;
   pump means coupled between said reservoir and a point in said column for recirculating said source material through said packing;
   a source of carrier gas;
   means for introducing the carrier gas into said column at a point remote from said outlet for causing said carrier gas to flow through said packing;
   whereby the carrier gas entrains vapor of said source material and transports said vapor from said column outlet to said deposition means.

2. Apparatus according to claim 1, wherein said vapor deposition means comprises a flame hydrolysis burner for hydrolyzing said vapor to form a soot.

3. Apparatus according to claim 1, wherein said means for introducing introduces the carrier gas into said column at a point below said packing, and said column outlet is disposed above said packing.

4. Apparatus according to claim 3, further including temperature control means for maintaining said liquid source material in said reservoir at a predetermined temperature.

5. Apparatus according to claim 4, wherein said means for introducing comprises mass flow control means for regulating the flow of the carrier gas.

6. Apparatus according to claim 5, further including a second packing disposed in said column between the point of introduction of said liquid source material and said outlet.

7. Apparatus according to claim 6, further including temperature control means disposed in heat transfer relationship with said second packing for maintaining said second packing at a predetermined temperature.

8. Apparatus according to claim 7, wherein said means for introducing expels carrier gas below the surface of said source material in said reservoir.

9. Apparatus for forming an optical waveguide blank having a radially varying index of refraction, comprising:
   vapor deposition means for receiving at least one source material vapor entrained in a carrier gas and directing said vapor towrd a starting member;
   means for rotatably disposing a substantially cylindrical starting member in proximity to said vapor deposition means for accumulating source material from said deposition means;
   a reservoir for retaining a quantity of the source material in liquid form;
   a column disposed above said reservoir and including a porous packing, said column having an outlet disposed above said packing and in fluid flow communication with said deposition means;
   pump means for withdrawing the source material from the reservoir and discharging the material into said column at a point above the lowermost end of said packing;
   a source of carrier gas;
   control means for determining the flow rate of said carrier gas; and
   means coupling said control means to said column for introducing carrier gas into said packing at a point below said outlet.

10. Apparatus according to claim 9, wherein said carrier gas is injected into said reservoir below the surface of the source material.

11. Apparatus according to claim 10, further including temperature control means associated with said reservoir for maintaining the source material at a predetermined temperature.

12. Apparatus according to claim 9, wherein said vapor deposition means comprises a flame hydrolysis burner, said burner serving to hydrolyze said vapor to form a glass soot.

13. Apparatus according to claim 11, wherein said control means further comprises a mass flow control for regulating the mass flow rate of said carrier gas into said reservoir.

14. Apparatus according to claim 13, wherein said packing comprises a multiplicity of discrete ceramic elements, said elements having surfaces which are substantially non-porous to the source material.

15. Apparatus according to claim 14, further including second packing means disposed within said column and above the discharge point of said pump means.

16. Apparatus according to claim 15, further including a second temperature control means disposed in heat transfer relation to said second packing for maintaining said second packing at a predetermined temperature.

17. Apparatus according to claim 16, wherein said second temperature is greater than the temperature of the source material in said reservoir.

18. Apparatus for use in a vapor deposition system for forming an optical waveguide blank including deposition means for directing a gaseous stream having a source material entrained in a carrier gas to a substrate, said apparatus comprising:

a column including a porous packing material disposed therein, said column having an outlet disposed above said packing for fluid flow communication with the deposition means;

a reservoir in fluid communication with said column for receiving liquid source material for flowing through said packing;

means coupled between said reservoir and said column for recirculating said source material through said packing; and means for introducing the carrier gas into said column remote from said outlet for causing the carrier gas to flow through said packing;

whereby the carrier gas entrains vapor of said source material and transports said vapor from said column outlet to said deposition means.

19. Apparatus according to claim 18, wherein said deposition means comprises a flame hydrolysis burner for hydrolyzing said vapor to form a soot.

20. Apparatus according to claim 18, wherein said means for introducing introduces the carrier gas into said column at point below said packing, and said column outlet is disposed above said packing.

21. Apparatus according to claim 18, wherein said means for recirculating comprises a pump.

* * * * *